United States Patent [19]

Cain et al.

[11] Patent Number: 5,148,959

[45] Date of Patent: Sep. 22, 1992

[54] WEDGE BONDING TOOL

[75] Inventors: Earl S. Cain, Napa; Jerome A. Carlson, San Mateo, both of Calif.

[73] Assignee: Tribotech, Napa, Calif.

[21] Appl. No.: 652,117

[22] Filed: Feb. 7, 1991

[51] Int. Cl.⁵ ............................................. B23K 37/02
[52] U.S. Cl. ..................................... 228/4.5; 228/904
[58] Field of Search ................. 228/4.5, 904, 54, 55, 228/44.7

[56] References Cited

U.S. PATENT DOCUMENTS

| | | | |
|---|---|---|---|
| 3,116,655 | 1/1964 | Esopi | 228/4.5 |
| 3,128,648 | 4/1964 | Clagett | 78/82 |
| 3,305,157 | 2/1967 | Pennings | 228/1 |
| 3,347,442 | 10/1967 | Reber | 228/44.7 |
| 3,461,538 | 8/1969 | Worcester et al. | 29/423 |
| 3,627,192 | 12/1971 | Killingsworth | 228/54 |
| 3,690,538 | 9/1972 | Gaiser et al. | 228/3 |
| 3,971,999 | 7/1976 | Goodrich, Jr. et al. | 228/54 |
| 4,600,138 | 7/1986 | Hill | 228/4.5 |

FOREIGN PATENT DOCUMENTS

| | | | |
|---|---|---|---|
| 48-30222 | 9/1973 | Japan | 228/44.7 |
| 63-308926 | 12/1988 | Japan | 228/4.5 |
| 1-122129 | 5/1989 | Japan | 228/904 |

Primary Examiner—Richard K. Seidel
Assistant Examiner—Jeanne M. Elpel
Attorney, Agent, or Firm—Flehr, Hohbach, Test, Albritton & Herbert

[57] ABSTRACT

A wedge bonding tool having a shank and a tapered work end including a narrow bonding tip for holding a wire against a surface to which it is to be bonded, a shank secured to said tapered work end for guiding wire to the rear of the tapered work end, and a wire guiding channel or passage for guiding wire from the shank to the narrow bonding tip.

6 Claims, 2 Drawing Sheets

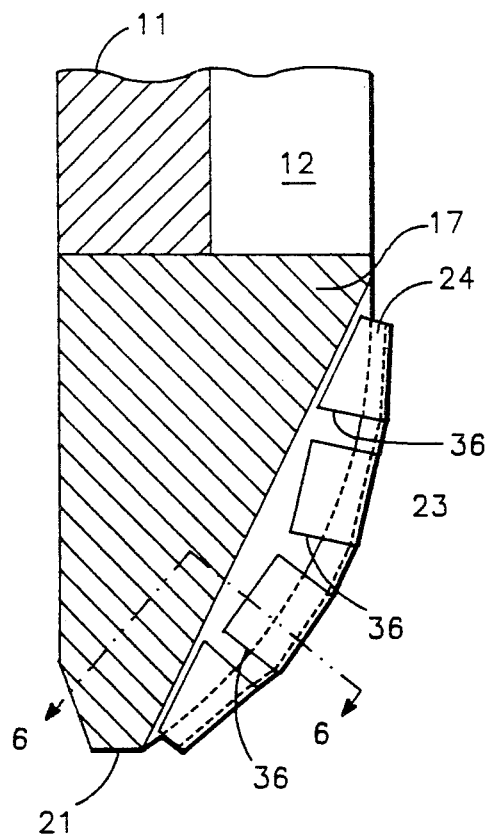
FIG.-1
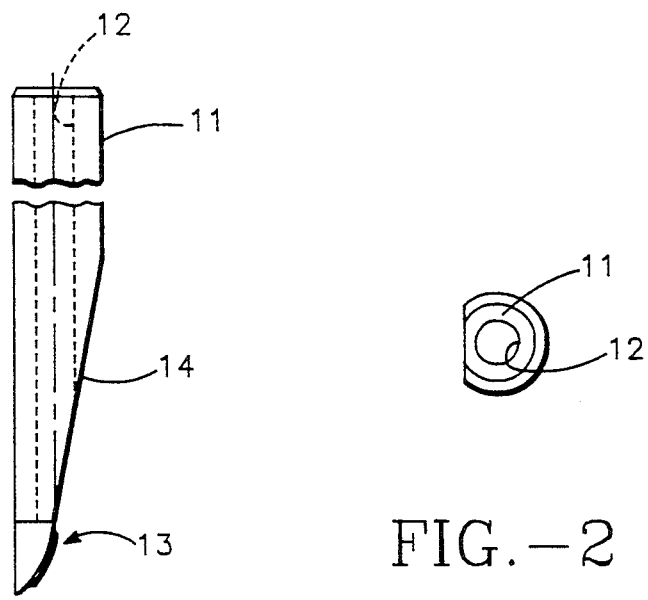
FIG.-2
FIG.-3
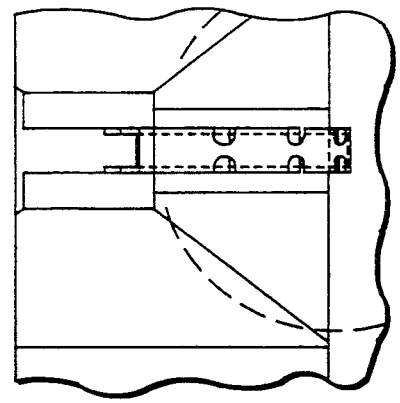
FIG.-4

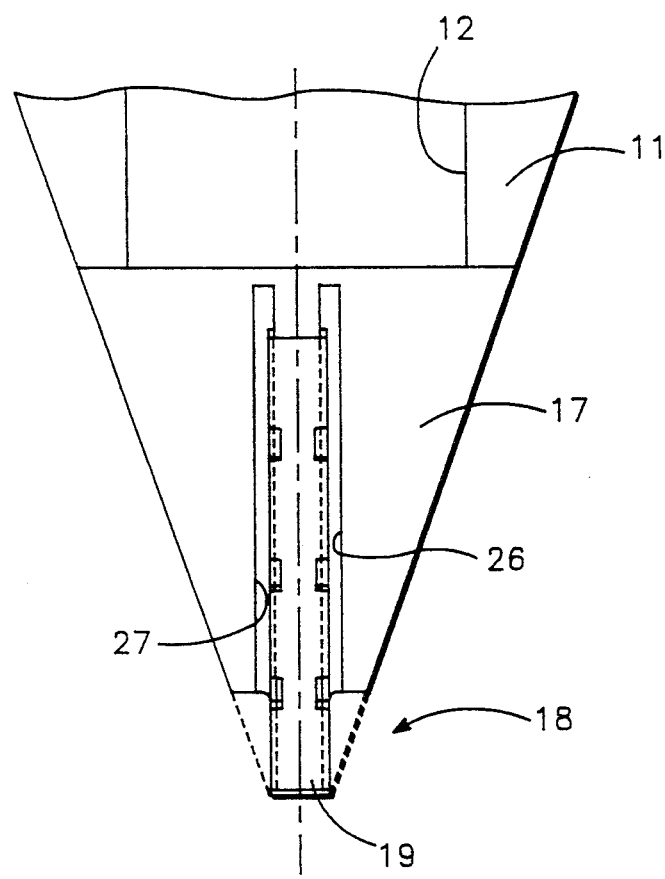
FIG.—5
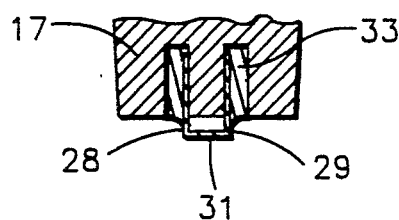
FIG.—6
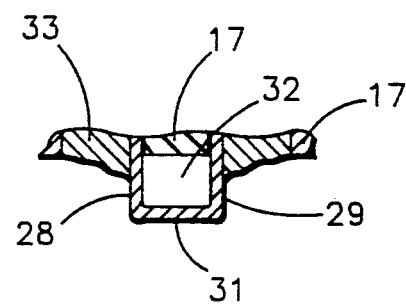
FIG.—7

WEDGE BONDING TOOL

BRIEF DESCRIPTION OF THE INVENTION

This invention relates generally to bonding tools for use in the semiconductor and electronic industry, and more particularly to wedge bonding tools having a separate wire feed channel.

BACKGROUND OF THE INVENTION

In U.S. Pat. No. 3,627,192, owned by the assignee of this application, there is described a wire bonding tool of the capillary or wedge type including a shank of a material having a high modulus of elasticity such as tungsten carbide with one end portion forming a bonding tip. A wire guiding hole machined into the tip presents the wire to be bonded to the tip. The end portion of the tool is made of an osmium alloy to provide an improved bond and increased tool life.

In U.S. Pat. No. 3,971,499, owned by the assignee of the present application, there is described a bonding wedge tool for joining or bonding wire leads to contact areas or elements in the semiconductor and electronic industry including a rectangular wire guiding hole extending therethrough cooperating with a positioning groove formed on the bonding tip.

In many applications in the semiconductor and electronic industry where lower impedance, higher thermal conductivity, lower electrical resistance and increased mechanical strength is required for interconnecting, a rectangular wire or ribbon is preferred over round wire. As devices decrease in size the lead pitch, spacing between leads, is reduced. There is a need for a bonding tool or wedge capable of handling fine ribbon. There is also a need for a bonding tool in which guiding holes need not be formed in the bonding tip to direct the wire. As used herein, wire includes wire of rounded cross-section or wire of rectangular cross-section (ribbon).

OBJECTS AND SUMMARY OF THE INVENTION

It is a general object of the present invention to provide an improved wire bonding tool.

It is another object of the present invention to provide a wedge bonding tool which allows free flow of wire between first and second bond locations and also during and after wire termination breaks.

It is another object of the present invention to provide a wedge bonding tool in which wire is fed from a vertical to a horizontal plane for bonding.

It is another object of the present invention to provide a ribbon bonding tool which includes a long narrow guide channel for preventing rotation of ribbon and for guiding the ribbon to the tool bonding pad.

It is another object of the present invention to provide a wedge bonding tool in which round or rectangular wire is guided to the bonding tip through a long narrow guide channel formed by cooperation between the bonding tip and a guide member secured to the bonding tip.

These and other objects of the invention are achieved by a bonding tool having a shank and a tapered work end including a narrow bonding tip for holding a wire against a surface to which it is to be bonded, a shank secured to said tapered work end for guiding wire to the rear of the tapered work end, and means secured to the rear of the tapered work end and defining therewith a wire guiding channel or passage for guiding wire from the shank to the narrow bonding tip.

BRIEF DESCRIPTION OF THE DRAWINGS

The foregoing, and other objects of the invention, will be more clearly understood from the following description when read in connection with the accompanying drawings of which:

FIG. 1 is a greatly enlarged side view of a bonding tool in accordance with the invention.

FIG. 2 is a top plan view of FIG. 1.

FIG. 3 is an enlarged view of the tapered working end of the bonding tool of FIG. 1.

FIG. 4 is a partial bottom view of the tool shown in FIG. 3.

FIG. 5 is a rear view of the tool shown in FIG. 3.

FIG. 6 is an enlarged partial sectional view taken along the line 6—6 of FIG. 3.

FIG. 7 is an enlarged sectional view of the elongated guiding channel shown in FIG. 6.

DESCRIPTION OF PREFERRED EMBODIMENT

Referring to FIG. 1, the bonding tool includes a shank 11 which may comprise a tungsten carbide tubing having a central bore 12 for receiving a bonding wire at the upper end and delivering it to the tapered work end 13 of the bonding tool. The shank is cut away whereby the central bore opens beginning with the region 14 and ending at the interface with the tapered work end 13. Thus, wire is fed vertically down through the bore and can extend outwardly to the rear of the tapered work end 13. The tapered work end may comprise a Microloy member 17 which tapers downwardly toward the tip end 18. The end of the member at the tip end is beveled to form a narrow bonding tip 19. The end of the tip includes the bonding surface 21 (FIG. 1) which includes rounded front and back radii which are exposed for ease of finishing and dimensional repeatability.

In contrast to the round or rectangular openings formed in the working end of bonding tools of the prior art to guide wires to the bonding tip 21, the present invention defines an elongated rectangular channel extending along the back of the tapered work end to adjacent to the tip 21. The rectangular channel serves to receive the wire leaving the bore 12 of the shank, and to guide the wire along the back of the bonding tool downwardly to and adjacent to the bonding tip 21.

The channel is defined by the back surface 23 of the tapered work end and the channel-shaped guide 24 whose section is that of three sides of a rectangle for guiding rectangular wire or ribbon, or of a different shape for guiding round wire. In the preferred embodiment, the rear of the tapered work end is machined to form a pair of spaced grooves 26 and 27 which receive the opposite sides 28 and 29 of the U-shaped channel. The other side 31 of the U-shaped channel is spaced from the back side of the tapered work end 17 to define therewith a shaped channel 32 which receives the wire at the upper end adjacent the shank and delivers the wire to the tip end 18. The channel-shaped guide may be retained in the grooves by means of a suitable adhesive 33 (FIG. 6).

The channel-shaped guide may be mechanically formed by slotting the sides of a channel as shown by the slots 36 (FIG. 3) and then bending the channel to the shape of the rear surface 23 of the tapered work end. In this embodiment, the channel then includes openings through which debris or dirt may egress. Alternatively, the sides of the guide may be solid and the guide electroformed to the shape of the tapered work end.

It is apparent that the guide is removable thereby permitting finishing of the back surface of the work end and also replacement of the guide if necessary. When the bonding tool is used for ribbon, the rectangular-shaped guide channel is formed to have a width slightly greater than the width of the bonding ribbon and a height slightly greater than the thickness of the ribbon whereby the ribbon is guided to accurately be centered on the bonding tip and is prevented from rotation by the rectangular channel. The shaped channel can similarly guide a rounded wire. The channel allows free flow looping of the wire between first and second bond locations and helps facilitate feeding the wire after the second bond wire termination break because of the free flow characteristics.

The end of the bonding tip may be provided with an osmium coating to increase gripping of the wire and increased wear of the tool. The addition of osmium coatings is described in U.S. Pat. Nos. 3,971,499 and 3,627,192 owned by the assignee of the present application.

Thus, there has been provided a bonding tool which has a separate channel cooperating with the back of the tool to guide wire to the bonding tip. The tool provides a ninety degree feed from the vertical to the horizontal plane, accurately centers the wire in both the lateral and fore-to-aft directions, precisely positions the wire onto the bonding pad center, and allows free flow looping of the wire between first and second bond location and helps the second bond wire feeding, after termination break, to be more consistent.

What is claimed:

1. A bonding tool including
    a tapered work end including a narrow bonding tip for holding a wire against a surface to which it is to be bonded,
    a shank secured to said tapered work end for guiding a wire along a vertical axis to the rear of said tapered work end, and
    guide means secured to the rear of said tapered work end and defining therewith a guide channel extending along the rear of said tapered work end, said guide means for guiding a wire tangentially along said tapered work end from said shank to said narrow bonding tip, and
    said guide channel having a portion adjacent said shank in alignment with said vertical axis 2. A wedge bonding tool including
    a tapered work end including a narrow bonding tip for holding a wire against a surface to which it is to be bonded,
    a shank secured to said tapered work end for guiding a wire along a vertical axis to the rear of said tapered work end, and
    guide means secured to the rear of said tapered work end and defining therewith a guide channel for guiding a wire from said shank to said narrow bonding tip, said tapered work end including spaced grooves formed in the rear of said tapered work end for receiving said guide means, and
    said guide channel having a portion adjacent said shank in alignment with said vertical axis.

3. A wedge bonding tool as in claim 2 in which said guide means comprises a channel shaped guide.

4. A wedge bonding tool including
    a tapered work end including a narrow bonding tip for holding a wire against a surface to which it is to be bonded,
    a shank secured to said tapered work end for guiding a wire along a vertical axis to the rear of said tapered work end, and
    guide means secured to the rear of said tapered work end and defining therewith a guide channel for guiding a wire from said shank to said narrow bonding tip, and said guide means having a portion adjacent said shank in alignment with said vertical axis said guide means comprising spaced grooves formed in the rear of said tapered work end and a channel-shaped guide whose section is that of three sides of a rectangle with opposite sides extending into said grooves to define with the rear of said tapered work end an elongated channel whose section is an oblong rectangle.

5. A wedge bonding tool as in claim 4 in which the sides of said channel-shaped guide are slotted to provide openings for egress of debris.

6. A wedge bonding tool as in claim 5 in which the height and width of said channel-shaped guide are slightly larger than the thickness and width of a wire ribbon to precisely guide the ribbon to the bonding tip and to prevent rotation of the ribbon as it is guided along said channel.

* * * * *